United States Patent [19]

Gebhardt

[11] Patent Number: 5,573,742
[45] Date of Patent: Nov. 12, 1996

[54] METHOD FOR THE PREPARATION OF HIGH PURITY ALUMINUM NITRIDE

[75] Inventor: Joseph J. Gebhardt, Malvern, Pa.

[73] Assignee: Martin Marietta Corporation, East Windsor, N.J.

[21] Appl. No.: 114,691

[22] Filed: Oct. 29, 1987

[51] Int. Cl.$^6$ .................................................. C01B 21/072
[52] U.S. Cl. .................................................. 423/412
[58] Field of Search .................................... 423/409, 412

[56] References Cited

U.S. PATENT DOCUMENTS

| | | | |
|---|---|---|---|
| 4,615,863 | 10/1986 | Inoue et al. | 156/DIG. 99 |
| 4,656,101 | 4/1987 | Yamazaki | 428/620 |
| 4,740,574 | 4/1988 | Bolt et al. | 501/96 X |
| 4,764,489 | 8/1988 | Bolt | 501/96 |
| 4,783,430 | 11/1988 | Su | 501/96 |

Primary Examiner—Peter A. Nelson
Attorney, Agent, or Firm—W. H. Meise; C. A. Berard; S. A. Young

[57] ABSTRACT

A process and apparatus for making high purity aluminum nitride from organometallic aluminum, such as an alkylaluminum compound. A gaseous alkylaluminum compound and gaseous ammonia are introduced into a heated reaction zone where the gases are mixed and high purity aluminum nitride is produced. The high purity aluminum nitride is collected in the form of a powder or deposited as a thick, dense layer on an appropriate substrate mounted in the reaction chamber. A carrier gas such as hydrogen gas, may be used to conduct the alkylaluminum compound from a suitable reservoir containing liquid alkylaluminum compound to the reaction chamber. A preferred alkylaluminum compound is triethylaluminum.

19 Claims, 1 Drawing Sheet

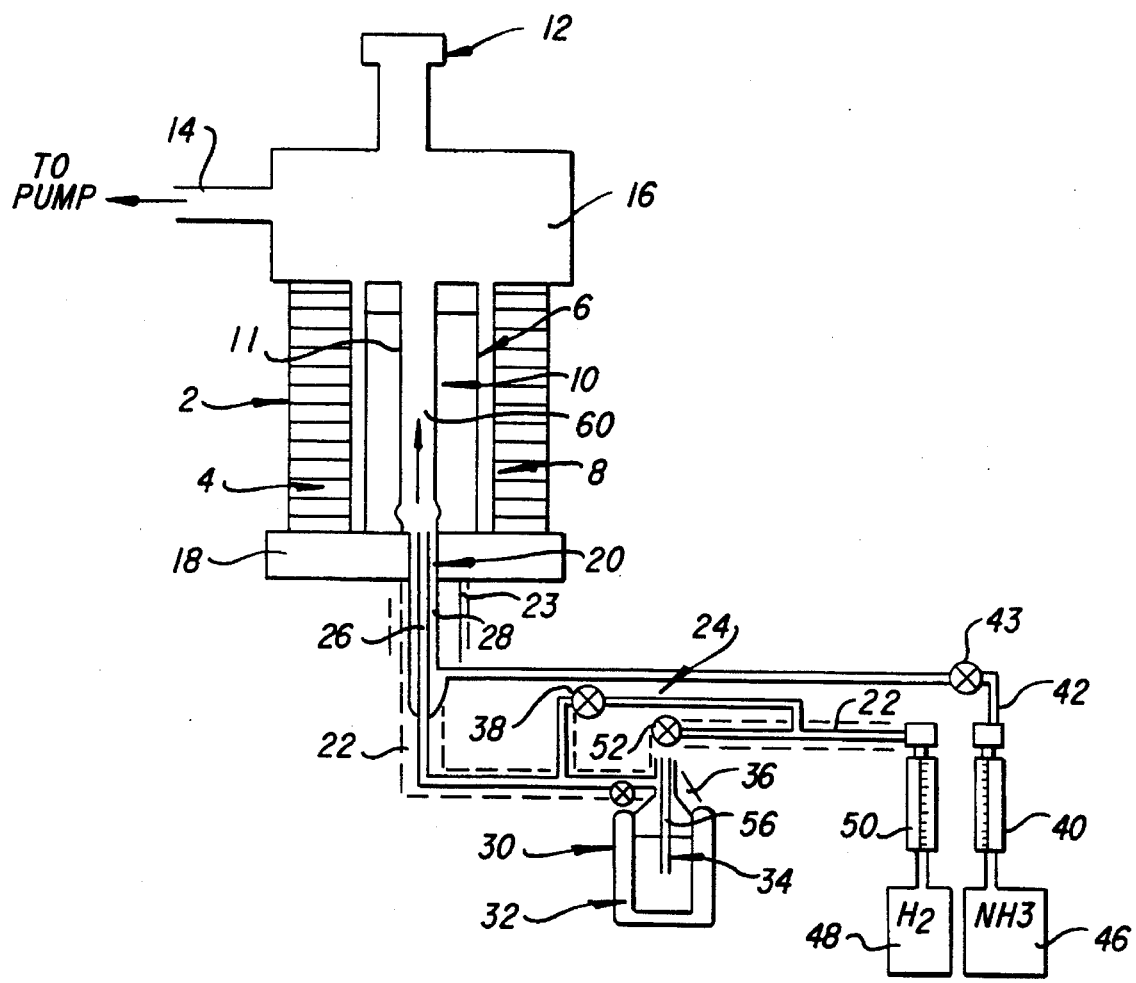

METHOD FOR THE PREPARATION OF HIGH PURITY ALUMINUM NITRIDE

This invention relates to a process and apparatus for the production of aluminum nitride, and more particularly, to a method and apparatus for the production of aluminum nitride by the pyrolysis of organoaluminum compounds.

BACKGROUND OF THE INVENTION

High purity antenna windows used in applications such as tactical missiles, re-entry vehicles, decoys and the like, are currently made from boron nitride. Antenna windows made from boron nitride are disadvantageous due to non-congruent vaporization at the temperatures to which the antenna windows are subjected during use. The inclusion of impurities such as silica, in the boron nitride affects the melting point, and blackout problems occur due to the non-congruent vaporization at temperatures at which the antenna windows are subjected during use.

Since aluminum nitride is known to vaporize congruently, blackout problems in antenna windows should not be encountered at elevated temperatures as in the case of antenna windows made with boron nitride.

Aluminum nitride is a refractory material, and it does not sublime appreciably at normal pressures until the temperature is in the range of about 2000° C. to about 2450° C. In U.S. Pat. No. 4,172,754, aluminum nitride is described as having useful electrical properties, notably as a thin film insulator and as a piezoelectric material of high surface-acoustic-wave velocity. Several prior art processes for making aluminum nitride are described in U.S. Pat. No. 4,172,754, which is incorporated herein by reference. In one prior art process ammonia and aluminum trichloride are combined in the gaseous phase in a multi-stage reaction to produce solid aluminum nitride and gaseous hydrogen chloride. U.S. Pat. No. 4,172,754 also describes the prior art process of making aluminum nitride by the organometallic process wherein ammonia is reacted in the gaseous phase in stages with aluminumtrimethyl to yield aluminum nitride solid and gaseous methane. This process is described as being disadvantageous because simple organometallic compounds tend to be unstable, and the final reaction stage tends to be homogeneous resulting in the deposition of aluminum nitride powder on the growing layer of aluminum nitride.

In other prior art processes, such as that described in U.S. Pat. No. 2,962,359, aluminum nitride is obtained by heating at a high temperature alumina and carbon in a nitrogen stream.

In U.S. Pat. No. 3,397,958, aluminum nitride is made relatively free of iron, silicon and titanium by the treatment of a bauxite (an impure aluminous material containing silica, iron oxide and titanium oxide) with carbon and sulfur at elevated temperatures in the presence of nitrogen. Other prior art processes of preparing aluminum nitride are described in U.S. Pat. No. 3,147,076 and U.S. Pat. No. 3,032,398.

The aluminum nitride made by the prior art processes generally contains sufficient impurities so that the aluminum nitride cannot be used to make high purity antenna windows. In most of the prior art processes, the entrainment or inclusion of impurities result in sufficient contamination of the antenna windows so that they cannot be used in the applications discussed above.

Although the prior art describes the use of aluminum-containing organometallic compounds for the formation of thin film passivating layers in integrated circuitry, such deposits are typically thin and non-crystalline. In antenna windows, it is necessary that the windows be made from crystalline deposits of high purity aluminum nitride.

SUMMARY OF THE INVENTION

Accordingly, it is the primary object of the present invention to provide an improved method and apparatus for the preparation of high purity grade aluminum nitride.

It is another object of the present invention to provide a method and apparatus for the preparation of high purity aluminum nitride which overcomes the disadvantages of the aluminum nitride made by the prior art methods and apparatus.

Still another object of the present invention is to provide a process and apparatus for the production of relatively thick, monolithic crystalline deposits of aluminum nitride suitable for the preparation of antenna windows.

Another object of the present invention is to provide a process and apparatus for the preparation of antenna windows from aluminum nitride prepared by the pyrolysis of organoaluminum compounds.

These and other objects are achieved by a process for making high purity aluminum nitride by reacting a vapor stream of an aluminum-containing organic compound, such as triethylaluminum, with a vapor stream of pure ammonia. A heated, gaseous aluminum-containing organic compound is conducted into a reaction zone; ammonia gas is introduced into the reaction zone; the heated gaseous aluminum-containing organic compound and the ammonia gas are mixed only in the reaction zone whereby high purity aluminum nitride is produced; and the high purity aluminum nitride is collected in the reaction zone.

The reaction zone is heated, and in preferred embodiments, a substrate is provided in the heated reaction zone for the deposition of a layer of crystalline aluminum nitride. The substrate may be of any suitable material, such as a high purity grade of graphite, which is surface-coated with pyrolytic carbon to maintain purity of the deposited crystalline aluminum nitride. The substrate may be any size or shape as desired.

In accordance with the present invention, there is also provided an apparatus for the preparation of aluminum nitride from organoaluminum compounds. The apparatus comprises a reaction chamber; means for placing or mounting a substrate in the reaction chamber; means for heating the reaction chamber; a source of gaseous organoaluminum compound; means for conducting the organoaluminum compound from the source to the reaction chamber; a source of pure ammonia; means for introducing the ammonia into the reaction chamber; means for mixing the organoaluminum compound and the ammonia only in the reaction chamber so that the aluminum nitride formed by the reaction of the organoaluminum compound and the ammonia deposits on the substrate; and means for removing gases from the reaction chamber. Means can also be provided for the adjustment of the flow rate of the organoaluminum compound and the ammonia into the reaction chamber and for adjusting or controlling the temperature in the reaction chamber so that powdered aluminum nitride can be formed instead of the layer of crystalline aluminum nitride on the substrate. The reaction chamber can also be heated immediately after the formation of the aluminum nitride to a temperature sufficient to remove incompletely reacted active fragments, to sinter the aluminum nitride and/or to permit grain growth in the powdered material or deposited layer of aluminum nitride. The substrate can be made of any suitable material and can be any geometric design so that the aluminum nitride layer formed thereon can conform to the particular geometric design. The geometric design of the substrate can complement the design of the antenna window so that the antenna window will have the desired shape when it is removed from the substrate.

In accordance with the present invention, it is critical that the means for conducting the organoaluminum compound from the source of the organoaluminum compound to the reaction chamber and the means for introducing the ammonia into the reaction chamber from the source of ammonia by separate means, for example, separate feed lines and metering systems, so that the mixing of the organoaluminum compound and the ammonia occurs only in the reaction chamber. Accordingly, in accordance with the present invention, it is critical that the heated, gaseous aluminum-containing organic compound be conducted or fed into the reaction zone separately from the ammonia gas.

By the process and apparatus of the present invention, high purity grade aluminum nitride suitable for use in fabricating low loss, high temperature antenna windows, has been prepared. In accordance with the present invention, it is possible to prepare high purity powdered precursors, that is, powdered aluminum nitride which is suitable for fabrication into antenna windows of high purity or of forming dense and relatively thick deposits of aluminum nitride on substrates which can be fabricated into antenna windows of high purity. The aluminum nitride prepared by the process of the present invention is of sufficiently high purity so that the problems caused by contamination with impurities which is characteristic of the prior art processes, have been substantially eliminated.

BRIEF DESCRIPTION OF THE DRAWING

The present invention will be further described by way of example only, with reference to the accompaying drawing, in which the schematic form illustrates a chemical vapor deposition system for the pyrolysis of an organoaluminum compound derived from a liquid organoaluminum compound, and ammonia.

DETAILED DESCRIPTION OF THE INVENTION

From the method and apparatus of the present invention, it is possible to prepare relatively thick, monolithic crystalline deposits of aluminum nitride on substrates as well as powdered aluminum nitride suitable for subsequent fabrication, such as forming the powdered aluminum nitride into a suitable shape and sintering or hot-pressing the powdered aluminum nitride. Furthermore, the powdered aluminum nitride obtained in the reaction zone or reaction chamber can be subjected to additional heat treatment to achieve chemical stability and/or a desired crystalline grain size.

In accordance with one of the preferred embodiments of the present invention, a relatively thick layer, for example, a layer greater than about 1 mm in thickness, of very high purity aluminum nitride is deposited on a suitable substrate, such as a high purity grade of graphite which is surface-coated with pyrolytic carbon to maintain purity of the product.

The use of a high purity ammonia gas and a high purity liquid organometallic aluminum precursor, such as triethylaluminum, in a closed environment in which subsequent processing steps, such as heat treatment, can also be performed after formation of the aluminum nitride, and the use of geometrically-shaped deposition substrates, permits the production of antenna windows from aluminum nitride having very minute quantities of impurity therein.

In the method and apparatus of the present invention, in order to obtain a high purity grade of aluminum nitride, for example, aluminum nitride having no greater than about 50 to about 100 ppm impurities, it is critical that the aluminum be derived from a gaseous aluminum-containing organic compound in the reaction zone or reaction chamber. The vapor stream of the aluminum-containing organic compound, that is, the precursor of the gaseous aluminum-containing organic compound, must be derived from a liquid alkylaluminum. Both dialkylaluminum hydride compounds and trialkylaluminum compounds and mixtures thereof, which are liquid at room temperature, may be used in the process and apparatus of the present invention.

The dialkylaluminum compounds are represented by the general formula $R_2HAl$. The trialkylaluminum compounds may be represented by the general formula $R_3Al$. In both instances, R is either a branched or straight-chain alkyl radical and is preferably an alkyl group having from 1 to about 4 carbon atoms.

Exemplary of the trialkylaluminum compounds are trimethylaluminum, triethylaluminum, tripropylaluminum, tri-isopropylaluminum, tributylaluminum, tri-isobutylaluminum and the like. Exemplary of the dialkylaluminum compounds are dimethylaluminum hydride, diethylaluminum hydride, dipropylaluminum hydride, di-isopropylaluminum hydride, dibutylaluminum hydride, di-isobutylaluminum hydride and the like. The foregoing compounds must be liquid and are converted to vapors in the process and apparatus of the present invention, and they must be able to withstand the heat necessary for the pyrolytic reaction with ammonia in the reaction zone or reaction chamber of the process and apparatus, respectively, of the present invention. Triethylaluminum is a dimeric liquid having a boiling point of 194° C. at atmospheric pressure, and tri-isobutylaluminum is a monomeric liquid having a boiling point of 86° C. at 10 mm Hg pressure and a melting point of 6° C.

The process of the present invention is preferably carried out in a resistance-heated vacuum deposition furnace of the type used for chemical vapor deposition. However, the process of the present invention can also be carried out using other devices and heating means including an appropriately designed heated tube. Alternative sources of heat can also be used to heat the furnace, and the substrate therein. For example, the substrate can be appropriately heated by using radio frequency. When the aluminum nitride is deposited as a layer on a substrate in the present invention, the substrate must be heated for the deposition. Generally, if the reaction chamber is heated, the substrate is heated at a temperature which approximates the reaction chamber temperature.

As shown in the drawing, a four inch (4") inside diameter vacuum deposition furnace 2 having appropriate insulation 4 is used as a reaction or deposition chamber 6 to contain collecting substrate 10 having a suitable deposition surface 11 thereon. Heating element 8 is used to provide sufficient heat within deposition chamber 6 to heat reaction chamber 6, including deposition substrate 10 to a suitable temperature. When substrate 10 is placed in deposition chamber 6, a reaction zone 60 is defined by deposition surfaces 11 of substrate 10.

The furnace 2 is supported on a suitable base 18, and in the embodiment shown, provision is made in base 18 for introducing the gaseous aluminum-containing organic compound and the ammonia gas into the reaction zone 60 by means of dual feeding means or nozzle 20. Removable cap or lid 16 provides a suitable seal for carrying out the process with the exclusion of the atmosphere (air and moisture). Port 14 is provided so that the interior of the furnace communicates to a suitable pump (not shown) for evacuation of deposition chamber 6. Sight port 12 provides visual access to the reaction zone and deposition process during the deposition of the aluminum nitride on the deposition surface 11 of substrate 10.

Substrate 10 can be placed in the reaction or deposition chamber 6 by any appropriate means so that the deposition surface 11 to be coated with a thick (greater than about 1.0 mm) deposit of aluminum nitride communicates with the gases being fed from dual nozzle 20. Deposition surfaces 11 must also be heated at the temperature of the deposition chamber 6 by heating element 8 to promote the deposition of the aluminum nitride on surfaces 11.

Any appropriate evacuation pump (not shown) may be used with the process and apparatus of the present invention including suitable traps (not shown) to remove exhaust gases from chamber 6.

The source of gaseous organoaluminum compound supplied to reaction zone 60 is reservoir 30 for containing liquid alkylaluminum compound 34, such as triethylaluminum. A heating element 32, such as a heating resistor element, is provided to heat reservoir 30 at a suitable temperature, such as a temperature of about 80° C. to about 200° C. The liquid alkylaluminum compound 34 is heated, vaporized and conducted from reservoir 30 through heated conduit 26 to reaction zone 60. Suitable heating means 22, such as resistor elements, are used to heat conduit 26 at a temperature sufficient to maintain the temperature of the alkylaluminum compound passing therethrough.

In one preferred embodiment as shown in the accompanying drawing, a gas, such as hydrogen gas, from a suitable source, such as a tank of hydrogen 48, passes through flowmeter 50 through suitable conduits and into liquid 34 in reservoir 30 through conduit 56 where the hydrogen gas carries vapors of the heated alkylaluminum compound 34 through conduit 26 into reaction zone 60. Valve 52 is used to control the flow of the hydrogen gas through the system. Any gas, such as hydrogen, or inert gases such as, helium, argon and the like, which does not interfere with the deposition of the aluminum nitride product, may be used in the present invention.

The alkylaluminum compound 34 is heated in reservoir 30 to a temperature of about 80° C. to about 200° C., depending on the particular gas and the desired end results, at a vapor pressure of about 80 Torr. to about 150 Torr. Hydrogen or an inert gas, passes through reservoir 30, preferably after preheating by resistance elements 22 at a temperature ranging from about 80° C. to about 200° C. and preferably at a rate of about 200 to about 800 scc per minute.

Ammonia vapor is passed through volumetric flowmeter 40 from a suitable source of ammonia, such as a tank of high grade purity ammonia 46 through conduit 42 into dual nozzle 20 where ammonia gas enters reaction zone 60 in chamber 6. The ammonia gas is preferably preheated by suitable heating elements, such as resistor elements 23 in the area where the ammonia gas approaches the dual nozzle 20. In this manner, the ammonia gas is preheated to a temperature which approximates the temperature of the alkylaluminum compound. The amount of ammonia entering chamber 6 can be appropriately controlled by valve 43 in line 42.

An optional purge/by-pass system 24 and valve 38 are used to purge chamber 6 of the ammonia gas and the gaseous aluminum-containing organic compound. Thus, the gases can be removed from the reaction chamber by utilization of the evacuation pump (not shown) or by forcing hydrogen gas through bypass system 24 and valve 38 into reaction chamber 6.

In an embodiment not shown, hydrogen gas can also be metered into the ammonia gas wherein the hydrogen gas operates as a carrier gas for the ammonia gas.

As shown in the accompanying drawing, triethylaluminum is contained as a liquid in cylinder or reservoir 30 from which it is removed as a vapor by utilizing hydrogen as a carrier gas. The carrier gas is suitably preheated, and the triethylaluminum is preheated at a temperature sufficient to provide the desired vapor pressure and feed rate to the reaction chamber 60 of furnace 2. The particular temperature, vapor pressure and feed rate can be adjusted and manipulated by one skilled in the art to provide the particular type of aluminum nitride desired for deposit on surface 11 of substrate 10 or to provide a powdered aluminum nitride as desired.

Since triethylaluminum and ammonia react on contact, ammonia is fed to furnace 2 through a separate feed line as illustrated by the separate feed lines entering dual nozzle 20. Mixing and reaction of the triethylaluminum and ammonia occur as the gases enter reaction zone 60. The product of reaction, namely, aluminum nitride, is carried to the deposition surface 11 where it deposits as a layer of aluminum nitride. The process and apparatus of the present invention are designed so that the gases are continuously fed into reaction zone 60 while the temperatures in the feed lines and deposition chamber 6 are maintained until the desired thickness which is greater than about 1 mm in thickness, is achieved on the surface of substrate 10.

In preferred embodiments, the substrate is in the form of a straight-sided graphite box or a graphite plate mounted perpendicular to the gas flow, where the aluminum nitride deposits as a white, crystalline layer.

When high purity aluminum nitride powder is desired, the flow rates of the respective gases are reduced and the temperature is lowered, for example, to approximately room temperature within the deposition chamber 6. Aluminum nitride powder forms within the chamber, and the powder can be subsequently heat treated in the closed environment in deposition chamber 6 to achieve appropriate grain size and subsequently heat treated in the same system at sintering temperatures, for example, in excess of about 1500° C. but less than the decomposition temperature of the aluminum nitride and preferably at about 1700° C. to about 1750° C., without exposure to the atmosphere to permit grain growth and resistance to hydrolysis. One skilled in the art can easily adjust the temperatures and flow rates of the respective gases in the system to achieve the powdered aluminum nitride.

In one preferred aspect of the present invention, a high temperature aluminum nitride antenna window is made by mounting a substrate shaped into a desired form of the antenna window in a reaction chamber; removing atmospheric air and moisture from the chamber and heating the substrate at a temperature in the range of about 500° C. to about 800° C.; conducting a heated, gaseous aluminum-containing organic compound into the reaction chamber, the gaseous aluminum-containing organic compound being derived from the aluminum-containing organic compound in the liquid state, and introducing ammonia gas into the reaction zone, the ammonia gas and gaseous aluminum-containing organic compound being maintained in separation prior to the reaction zone. Eight hundred degrees C is near the maximum deposition temperature. Above about 800° C., carbon and/or $Al_4C_3$ can be found to form through the decomposition of the alkyl radicals present in the precursor organoaluminum compound. The heated gaseous aluminum-containing organic compound and the ammonia gas are mixed in the reaction zone while maintaining the temperature of the substrate at the temperature of about 500° C. to about 800° C., whereby high purity aluminum nitride is produced. The high purity aluminum nitride is collected on the substrate by deposition. The heated, gaseous aluminum-containing organic compound and the ammonia gas are continuously fed into the reaction zone until the desired amount of aluminum nitride is deposited on the substrate; after appropriate heat treatment the substrate is cooled and removed from the reaction chamber; and the aluminum nitride layer deposited on the substrate is removed from the substrate to provide the antenna window.

The following specific examples describe the process of the present invention. They are intended for illustrative purposes only and should not be construed as limiting the present invention.

EXAMPLE 1

Using the system and apparatus as shown in the accompanying drawing, triethylaluminum was heated in reservoir 30 to a temperature of 140° C. where a vapor pressure of about 110 Torr. prevailed. Hydrogen gas was passed through reservoir 30 after preheating to a temperature of 120° C. at a rate of 500 scc per min., and the mixture of hydrogen and triethylaluminum vapor was passed into the furnace through the heated feed line. The calculated rate of feed of triethylaluminum was 48 scc per min. Ammonia vapor was passed through a volumetric flowmeter at a rate of 500 scc per min. directly into the furnace through the feed line adjacent to the triethylaluminum-hydrogen feed line. The furnace was heated at approximately 750° C. (estimated) and a white crystalline layer of aluminum nitride having a thickness of 2 mm was deposited in the region of the furnace estimated to be approximately 750° C. The deposit was removed, and by X-ray diffraction analysis, the deposit was determined to be crystalline aluminum nitride. An emission spectrographic analysis showed the only impurity in the deposit to be 50 parts per million of silicon.

EXAMPLE 2

Using the system and apparatus of the accompanying drawing, a substrate consisting of a vertical box having dimensions of 1.5 inches square was mounted in the reaction chamber or deposition chamber of the furnace, and the furnace was heated at approximately 820° C. The substrate was made from a commercially available carbon-impregnated graphite. The carbon-impregnated graphite was selected to match the thermal expansion coefficient of aluminum nitride. The ammonia gas and triethylaluminum vapor were metered into the reaction zone under the conditions described in Example 1 above. A white deposit of about 1.5 mm in thickness was obtained on the wall of the graphite box.

An X-ray diffraction analysis showed that the white deposit was crystalline aluminium nitride. However, the analysis of the crystalline aluminum nitride showed a lower purity than the crystalline aluminum nitride of the first example, possibly due to impurities in the selected substrate.

From the foregoing description, one skilled in the art can easily ascertain the essential characteristics of the present invention, and without departing from the spirit and scope thereof, can make various changes and modifications of the invention to adapt it to various other uses and conditions.

What is claimed is:

1. A process for making high purity aluminum nitride, comprising the steps of:
    a) placing in a reaction zone a substrate material selected to have a coefficient of thermal expansion closely matching that of aluminum nitride;
    b) conducting, a heated, gaseous aluminum-containing organic compound into said reaction zone;
    c) introducing ammonia gas into said reaction zone;
    d) mixing said heated, gaseous aluminum-containing organic compound and said ammonia gas in said reaction zone, whereby high purity aluminum nitride is produce on said substrate.

2. The process of claim 1 further comprising heating the high purity aluminum nitride in the reaction zone after the high purity aluminum nitride has been collected therein.

3. The process of claim 1 wherein the substrate is made from graphite surface-coated with pyrolytic carbon.

4. The process of claim 2 wherein the high purity aluminum nitride is heated at a temperature sufficient to increase grain size.

5. The process of claim 1 further comprising conducting the heated, gaseous aluminum-containing organic compound in a carrier gas into the reaction zone.

6. The process of claim 5 wherein the carrier gas is hydrogen.

7. The process of claim 1 wherein the aluminum-containing organic compound is an alkyl-aluminum.

8. The process of claim 7 wherein the alkylaluminum is a trialkylaluminum compound selected from the group consisting of triethylaluminum, trimethylaluminum, tripropylaluminum, tri-isopropylaluminum, tributylaluminum, tri-isobutylaluminum and mixtures thereof or the alkylaluminum is a dialkylaluminum hydride selected from the group consisting of dimethylaluminum hydride, diethylaluminum hydride, dipropylaluminum hydride, di-isopropylaluminum hydride, dibutylaluminum hydride, di-isobutylaluminum hydride and mixtures thereof.

9. The process of claim 1 wherein the ammonia gas is introduced into the reaction zone with a carrier gas.

10. The process of claim 9 wherein the carrier gas is hydrogen.

11. The process of claim 1 further comprising heating the reaction zone.

12. The process of claim 11 wherein the reaction zone is heated at a temperature of about 500° C. to about 800° C.

13. The process of claim 1 wherein the aluminum-containing organic compound is heated at a temperature of about 80° C. to about 200° C.

14. The process of claim 5 wherein the inert carrier gas is heated at a temperature of about 80° C. to about 200° C.

15. The process of claim 1 further comprising heating the ammonia gas prior to introducing the ammonia gas into the reaction zone.

16. The process of claim 15 wherein the ammonia gas is heated at a temperature of about 80° C. to a temperature of about 200° C.

17. The process of claim 1 wherein the aluminum-containing organic compound is a liquid prior to conducting the heated, gaseous aluminum-containing organic compound into the reaction zone.

18. The process of claim 1 further comprising continuously conducting the heated, gaseous aluminum-containing organic compound and continuously introducing ammonia gas into the reaction zone to collect a layer of high purity aluminum nitride having a thickness greater than 1 mm.

19. A method for making a high purity aluminum nitride window, said method comprising the steps of:

(a) placing a substrate in a reaction zone;

(b) conducting a heated, gaseous aluminum-containing organic compound into said reaction zone;

(c) introducing ammonia gas into said reaction zone;

(d) mixing said heated, gaseous aluminum-containing organic compound with said ammonia gas in said reaction zone, whereby high-purity aluminum nitride is formed on said substrate; and (e) continuing said conducting, introducing and mixing steps until said aluminum nitride has a thickness of at least 1.0 mm.

* * * * *